United States Patent [19]
Ward et al.

[11] Patent Number: 4,976,843
[45] Date of Patent: Dec. 11, 1990

[54] PARTICLE BEAM SHIELDING

[75] Inventors: Billy W. Ward, Rockport; David Edwards, Jr., Hamilton; Robert A. Casella, Salem, all of Mass.

[73] Assignee: Micrion Corporation, Peabody, Mass.

[21] Appl. No.: 474,348

[22] Filed: Feb. 2, 1990

[51] Int. Cl.⁵ ............................................. B23K 15/00
[52] U.S. Cl. .......................... 204/298.36; 204/192.34; 156/345; 250/492.3
[58] Field of Search ...................... 204/192.32, 192.34, 204/298.11, 298.36; 250/398, 492.1, 492.3; 156/345

[56] References Cited

U.S. PATENT DOCUMENTS

| | | | |
|---|---|---|---|
| 4,609,809 | 9/1986 | Yamaguchi et al. | 204/192.34 X |
| 4,639,301 | 1/1987 | Doherty et al. | 250/398 X |
| 4,641,034 | 2/1987 | Okamura et al. | 250/398 X |
| 4,851,097 | 7/1989 | Hattori et al. | 204/298.36 X |
| 4,874,460 | 10/1989 | Nakagawa et al. | 204/298.36 X |
| 4,908,226 | 3/1990 | Kubena et al. | 250/492.3 X |

Primary Examiner—Nam X. Nguyen
Attorney, Agent, or Firm—Fish & Richardson

[57] ABSTRACT

An apparatus is described for allowing an ion beam and an electron beam to travel toward a predetermined region of a substrate surface during the sputter etching and imaging of insulating and other targets while preventing deflection of the electron beam by sources of stray electrostatic fields on the substrate surface. A metal shield is provided having a funnel-shaped portion leading to an orifice. The incident finely focused ion beam, together with the electron beam, which is used to neutralize the charge created by the incident ion beam, pass to the target through the orifice. The shield also physically supports a gas injection needle that injects a gas through the orifice toward the predetermined region.

15 Claims, 3 Drawing Sheets

PARTICLE BEAM SHIELDING

The present invention relates in general to focused particle beam processing and more particularly to a shield that allows ion and electron beams to travel toward a predetermined region of a substrate surface, while preventing deflection of the electron beam by stray electrostatic fields, and that supports a gas injection needle that injects a gas toward the predetermined region.

The particle beam shield according to the invention is most preferably used in connection with a focused ion beam processing apparatus such as is described in U.S. Pat. No. 4,639,301, which is hereby incorporated in its entirety by reference.

Referring to FIG. 1, there is shown the focused ion beam processing apparatus of U.S. Pat. No. 4,639,301, which may be used for sputter etching and imaging of targets that retain electrical charge. Ion source 11 provides ions focused by lens 12 to form a finely focused ion beam 14 that is deflected by deflecting plates 13 to impinge upon surface 15 of substrate 16. A low energy electron gun 17 has an electron source, a control grid 18, and an extraction electrode 22 that permit a low energy (less than 1,000 V) beam of electrons 21 to bathe a portion of surface 15 surrounding the point of submicron shape at which ion beam 14 is sharply focused upon surface 15. The beam of electrons neutralizes the surface charge produced by ion beam 14, thereby reducing defocusing and undesired deflection of ion beam 14 and allowing precise positioning of the ion beam and maintenance of its submicron position and shape. An ion mass detector 24 detects ions sputtered from surface 15 and determines their mass, and electron and ion detector 26 detects either electrons or ions sputtered from surface 15. Substrate 16 may be supported on a mechanical stage, preferably having precision mechanical displacement mechanisms for displacement in mutually orthogonal directions, so that substrate surface 15 can be positioned under ion beam 14 as is desired and appropriate in an etching or imaging process. Focused ion beam processing apparatus such as is described in U.S. Pat. No. 4,639,301 may also include a gas-injection needle that injects a gas mixture onto the region of the substrate surface at which the ion beam is targeted.

Referring to FIG. 2, there is shown a schematic representation of a number of events that occur when ion beam 14 impinges upon surface 15 of substrate 16. Specifically:

(1) Low energy secondary electrons are generated.

(2) Positive and negative low energy secondary ions are generated.

(3) Atoms are sputtered away from surface 15.

(4) Primary ions from beam 14 are implanted into surface 15 and also backscattered from surface 15.

According to the invention, there is a shield that allows the ion beam and the neutralizing electron beam to travel toward a predetermined region of the substrate surface, while preventing deflection of the electron beam by sources of electric fields located outside the predetermined region. The shield is an electrically conductive surface located between the substrate surface and the sources of the ion beam and the electron beam together with the detectors. The shield has an orifice through which the ion beam and the electron beam can pass as they travel to the substrate surface. The shield preferably prevents deflection of the ion beam and secondarily emitted charged particles by sources of electric fields located outside the predetermined region, and prevents the secondarily emitted particles from impinging upon regions of the substrate surface outside of the predetermined region. The shield preferably has a funnel-shaped portion narrowing to the orifice. The secondarily emitted particles pass through the orifice as they travel from the substrate surface to the detectors. According to another aspect of the invention, the shield physically supports a gas-injection needle that injects a gas through the orifice toward the predetermined region, thus avoiding the use of a precision displacement mechanism to support the gas-injection needle and adjust the position of the needle.

Numerous other features, objects, and advantages of the invention will become apparent from the following specification when read in connection with the accompanying drawings in which:

BRIEF DESCRIPTION OF THE DRAWINGS

Referring to FIG. 3, there is shown a pictorial diagram of an improved focused ion beam processing apparatus according to the invention. A metal particle beam shield 40, having funnel-shaped portion 44 narrowing to orifice 46, is placed over substrate surface 15 so that orifice 46 is located immediately above the region on substrate surface 15 at which ion beam 14 is directed. Orifice 46 is large enough to encompass an area of about 1 square millimeter, which constitutes the dimensions of the region within which deflector 13 may deflect ion beam 14. Electron gun 17 is directed at an angle of ninety degrees to the normal of substrate surface 15.

Shield 40 physically supports a gas-injection needle 48 in a manner such that needle 48 can inject a mixture of gasses through orifice 46. The tip of gas-injection needle 48 is preferably located within orifice 46 itself. As the mechanical stage that supports substrate 16 moves, it may be necessary to reposition shield 40 to avoid interference with objects mounted on the stage. Because shield 40 physically supports gas-injection needle 48, however, it is not necessary to provide a precision displacement mechanism, which can be costly, in order to reposition gas-injection needle 48 to avoid interference with objects mounted on the stage. Rather, the position of the gas-injection needle can be adjusted merely by adjusting the position of shield 40.

Figure 1:
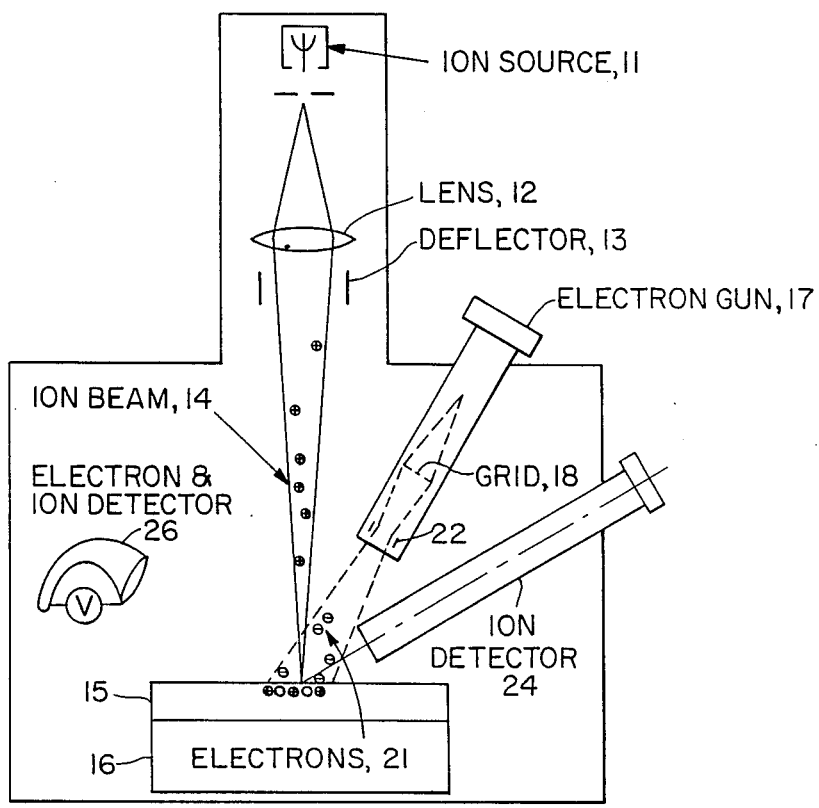
FIG. 1 is a pictorial diagram of a known focused ion beam processing apparatus.
Figure 2:
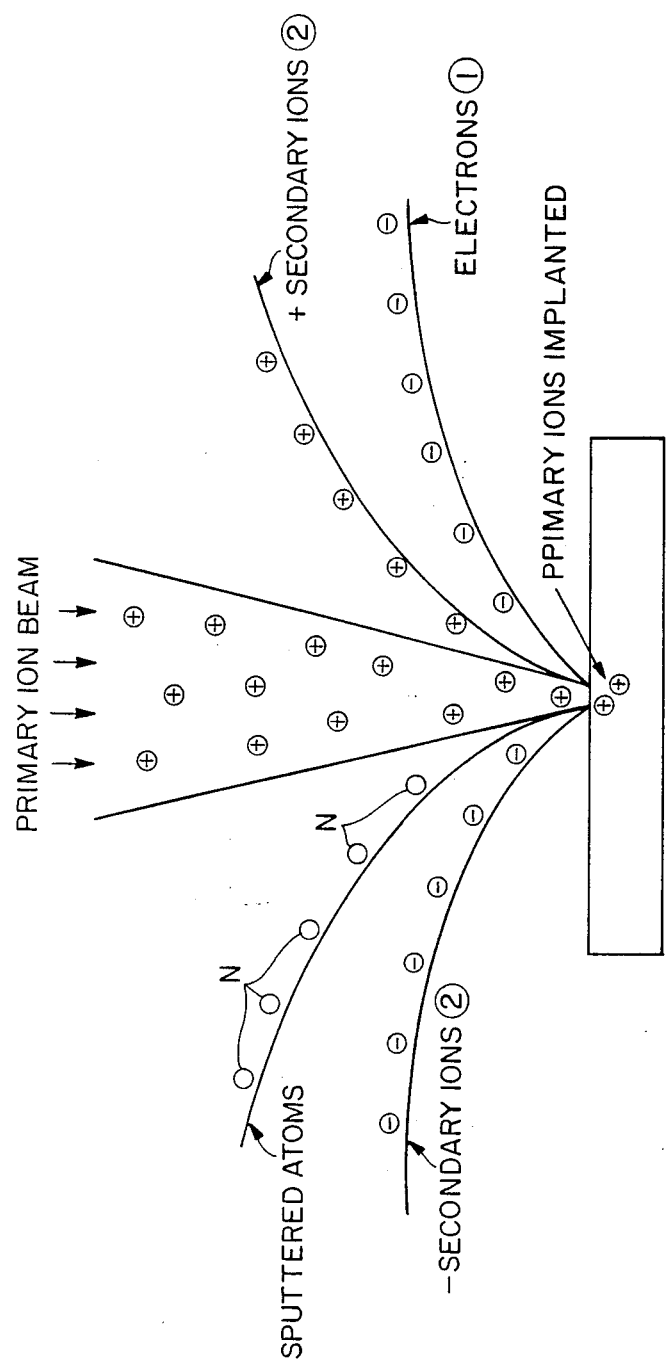
FIG. 2 is a schematic representation of the etching process in the known focused ion beam processing apparatus of FIG. 1.
Figure 3:
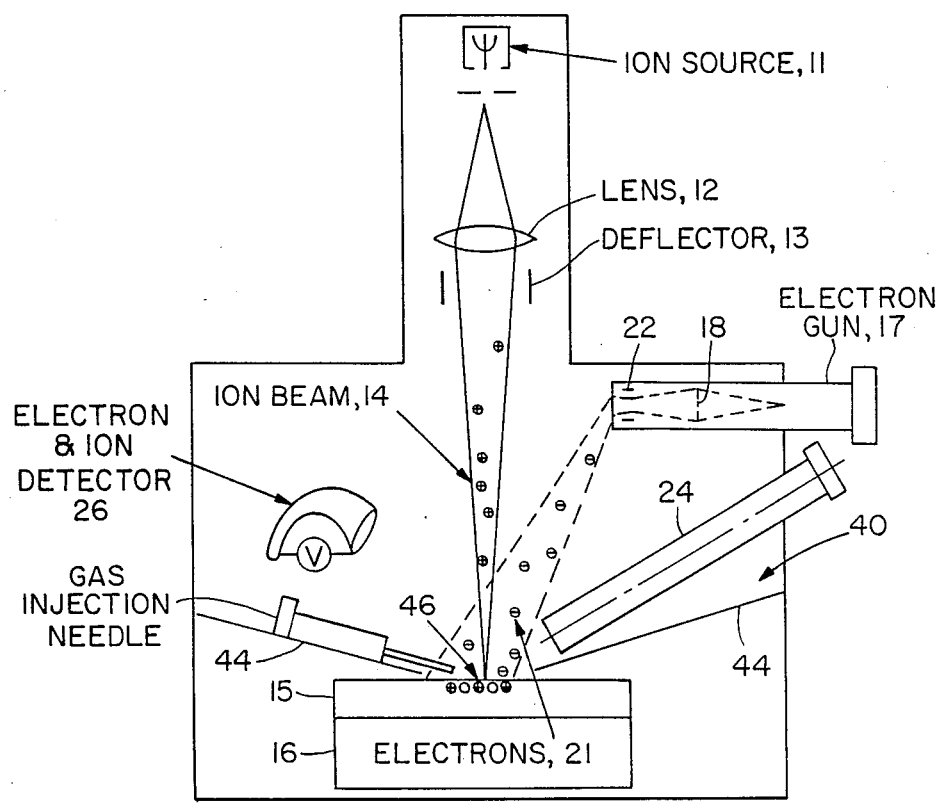
FIG. 3 is a pictorial diagram of an improved focused ion beam processing apparatus according to the invention.

The system arrangement having been set forth, its mode of operation will be described. The system of FIG. 3 is useful in etching or imaging of substrates 16, such as optical and ion masks and x-ray lithography masks and reticles, which typically are subject to charge accumulation when bombarded by positive ions. To this end, typically before substrate 16 is inserted into the ion beam processing apparatus, extraction electrode 22 is precalibrated to deflect electron beam 21 from electron gun 17 toward a location, at the level of the substrate surface, at which ion beam 12 is directed. Substrate 16 is inserted into the apparatus in a manner such that the region of substrate surface 15 at which etching or imaging is to take place is positioned directly below orifice 46 of shield 40. Needle 48 injects a gas mixture through orifice 46 and toward the region of substrate surface 15 located directly below orifice 46. The gas molecules tend to stick to the substrate surface. Ion beam 14 originates from an ion source providing ions that are accelerated and focused by electrostatic lens 12. Deflector 13 may precisely position ion beam 14 at target points within a field of view on surface 15 typically approximately 1 square millimeter in area. Ion beam 14 passes unobstructed through orifice 46 of shield 40 on its way to substrate surface 15. The ions collide with the gas molecules on the substrate surface. The electrons pass through orifice 46 to neutralize the positive charge of the incident ions on substrate surface 15. Electron beam 21 thereby eliminates an undesired electric field that would otherwise interfere with the ion beam shape at the substrate surface and that would also interfere with the trajectories of ions and electrons as they leave the surface.

Substrates such as quartz or glass tend to become charged statically when rubbed against or otherwise brought into contact with other objects. An electrostatic field can not pass through metal however. Thus, metal shield 40 shields electron beam 21 from stray electrostatic fields located on substrate surface 16 that would otherwise tend to deflect electron beam 21 away from the region of substrate surface 16 at which ion beam 14 is directed. Deflection of electron beam 21 could lead to a buildup of incident ion charge, which creates an electric field that interferes not only with the ion beam shape at the surface, but also interferes with the trajectories of ions and electrons as they sputter from the surface. Shield 40 also prevents deflection of the ion beam by sources of electric fields located outside the predetermined region.

Secondary ions, secondary electrons, and atoms sputter away from substrate surface 15 as primary ion beam 14 impinges upon the substrate surface, and pass through orifice 46 of shield 40. Electron and ion detector 24 can detect either secondary electrons or secondary ions, and ion detector 24 can determine the mass, and hence the type, of the secondary ions. The information obtained from these detectors can be used to control the etching or imaging process. As charged particles sputter away from the substrate surface, the metal shield 40 shields the secondarily emitted particles from stray electrostatic fields emanating from the substrate surface, thereby preventing the charged particles from becoming attracted to and impinging upon the substrate surface and hence allowing for accurate detection by detectors 24 and 26.

There has been described a novel and improved apparatus and technique that allows particle beams to travel toward a predetermined region of a substrate surface, prevents deflection of a particle beam by stray electrostatic fields emanating from the substrate surface, and physically supports a gas injector that injects a gas toward the predetermined region. It is evident that those skilled in the art may now make numerous uses and modifications of and departures from the specific embodiment described herein without departing from the inventive concept. Consequently, the invention is to be construed as embracing each and every novel feature and novel combination of features present in or possessed by the apparatus and technique herein disclosed and limited solely by the spirit and scope of the appended claims.

What is claimed is:

1. Particle beam processing apparatus comprising,
    a first source of a first particle beam of charged particles for impingement upon a target point within a predetermined region of a substrate surface in a predetermined surface plane,
    a second source of a second particle beam of particles charged oppositely to said first particle beam, for flooding said predetermined region of said substrate surface, and
    a shield comprising an electrically conductive surface located between said substrate surface and said sources of said first particle beam and second particle beam, said shield having an orifice located above said predetermined region through which said first and second particle beams can pass as said charged particles travel from said first and second sources to said predetermined region of said substrate surface,
    said shield being constructed to allow said first and second particle beams to travel toward said predetermined region of said substrate surface located directly below said orifice, and to prevent deflection of said second particle beam by sources of electric fields located outside said predetermined region of said substrate surface.

2. Particle beam processing apparatus in accordance with claim 1, wherein said shield is constructed to prevent deflection of said first particle beam by sources of electric fields located outside said predetermined region of said substrate surface.

3. Particle beam processing apparatus in accordance with claim 1 wherein said first particle beam is an ion beam and said second particle beam is an electron beam.

4. Particle beam processing apparatus in accordance with claim 3 wherein said electron beam neutralizes surface charge in said surface plane otherwise produced thereat by said ion beam in order to reduce defocusing and undesired deflection of said ion beam in said surface plane.

5. Particle beam processing apparatus in accordance with claim 4 wherein,
    said ion beam is finely focused and of submicron shape, and
    said neutralization of said surface charge allows precise positioning of said ion beam on a target point and maintenance of said submicron shape of said ion beam on said target point.

6. Particle beam processing apparatus in accordance with claim 1 further comprising a gas injector for injecting a gas through said orifice and toward said predetermined region of said substrate surface.

7. Particle beam processing apparatus in accordance with claim 6 wherein said shield physically supports said gas injector.

8. Particle beam processing apparatus in accordance with claim 7 wherein
    said first particle beam is an ion beam,
    said second particle beam is an electron beam,
    molecules of said gas tend to stick to said substrate surface, and
    ions of said ion beam collide with said molecules of said gas on said substrate surface.

9. Particle beam processing apparatus in accordance with claim 1 wherein said shield comprises a funnel-shaped portion narrowing to said orifice.

10. Particle beam processing apparatus in accordance with claim 1 further comprising detecting means for sensing particles secondarily emitted from said surface plane in response to impingement of said first particle beam upon said substrate surface, said shield being constructed to allow said secondarily emitted particles to pass through said orifice as they travel from said predetermined region of said substrate surface to said detecting means, and to prevent deflection of secondarily emitted particles by sources of electric fields located outside said predetermined region of said substrate surface.

11. Particle beam processing apparatus in accordance with claim 10 wherein said shield is constructed to prevent said secondarily emitted particles from impinging upon regions of said substrate surface other than said predetermined region.

12. Particle beam processing apparatus in accordance with claim 10 wherein said detecting means comprises a secondary ion mass detector for sensing the types of ions leaving said substrate surface in response to impingement of said ion beam upon said substrate surface.

13. Particle beam processing apparatus in accordance with claim 12 wherein said detecting means further comprises an electron and ion detector for detecting electrons and ions secondarily emitted from said substrate surface in response to impingement of said ion beam upon said substrate surface.

14. Particle beam processing apparatus comprising,
a first source of a first particle beam of charged particles for impingement upon a predetermined region of a substrate surface in a predetermined surface plane,
a second source of a second particle beam of particles charged oppositely to said first particle beam, for flooding said region of said substrate surface,
a shield comprising an electrically conductive surface located between said substrate surface and said source of said first particle beam, said shield having an orifice located above said predetermined region through which said first and second particle beams can pass as said charged particles travel from said first and second sources to said predetermined region of said substrate surface, said shield being constructed to allow said first and second particle beams to travel toward said predetermined region of said substrate surface located directly below said orifice, and
a gas injector for injecting a gas through said orifice and toward said predetermined region of said substrate surface, said shield physically supporting said gas injector.

15. Particle beam processing apparatus in accordance with claim 14 wherein
said first particle beam is an ion beam,
said second particle beam is an electron beam,
molecules of said gas tend to stick to said substrate surface, and
ions of said ion beam collide with said molecules of said gas on said substrate surface.

* * * * *